(12) United States Patent
Hasegawa

(10) Patent No.: US 6,350,683 B1
(45) Date of Patent: Feb. 26, 2002

(54) METHOD OF FORMING A TUNGSTEN PLUG IN A HOLE

(75) Inventor: Mieko Hasegawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/644,044

(22) Filed: Aug. 23, 2000

(30) Foreign Application Priority Data

Aug. 23, 1999 (JP) .......................................... 11-235543

(51) Int. Cl.[7] .......................................... H01L 21/9763
(52) U.S. Cl. ...................... 438/648; 438/631; 438/656; 438/685
(58) Field of Search .................................. 438/622, 631, 438/633, 648, 656, 685

(56) References Cited

U.S. PATENT DOCUMENTS

| | | | |
|---|---|---|---|
| 5,028,565 A | * | 7/1991 | Chang et al. |
| 5,407,698 A | * | 4/1995 | Emesh .......................... 427/99 |
| 5,434,110 A | * | 7/1995 | Foster et al. |
| 5,956,609 A | * | 9/1999 | Lee et al. .................... 438/627 |
| 6,066,366 A | * | 5/2000 | Berenbaum et al. ........ 427/250 |

* cited by examiner

Primary Examiner—Trung Dang
(74) Attorney, Agent, or Firm—Young & Thompson

(57) ABSTRACT

The present invention provides a method of forming a tungsten plug in a hole of an inter-layer insulator. The method comprises the steps of: forming at least a hole in an inter-layer insulator; forming a thin barrier layer on at least an inside face of a hole; carrying out a first chemical vapor deposition process for growing a micro crystal tungsten thin film on the thin barrier layer; carrying out a second chemical vapor deposition process for growing a tungsten layer from the micro crystal tungsten thin film, so that the tungsten layer fills the hole and also extends over a top surface of the inter-layer insulator; and carrying out a chemical mechanical polishing process for selectively removing the tungsten layer over the top surface of the inter-layer insulator and leaving the tungsten layer in the hole, thereby to form a tungsten plug in the hole, wherein the second chemical vapor deposition process is carried out at a substrate temperature of not less than 475° C. and at a growth chamber pressure in the range of 90 Torr to 150 Torr, so that the tungsten layer has a high film density.

38 Claims, 12 Drawing Sheets

METHOD OF FORMING A TUNGSTEN PLUG IN A HOLE

BACKGROUND OF THE INVENTION

The present invention relates to a method of forming a semiconductor device having a multi-layered structure, and more particularly to a method of forming a tungsten plug existing in either a through hole formed in a second level or higher level inter-layer insulator for eclectically connecting two different level interconnections or a contact hole formed in a first level inter-layer insulator extending over a semiconductor substrate for eclectically connecting an interconnection and a semiconductor device formed on the semiconductor substrate.

In the multi-layered structure of the semiconductor device, a metal plug is formed in a through hole formed in a second level or higher level inter-layer insulator for eclectically connecting two different level interconnections extending over and under surfaces of the second level or higher level inter-layer insulator. A metal plug is also formed in a contact hole formed in a first level inter-layer insulator extending over a semiconductor substrate for eclectically connecting a first level interconnection extending over the first level inter-layer insulator and a semiconductor device formed on the semiconductor substrate. In this specification, the term "hole" means to include both the through hole and the contact hole. In the prior art, the metal plug comprises an aluminum plug deposited by a sputtering method. As the shrinkage of the semiconductor device has been on the increase, an aspect ratio of the hole such as the through hole or the contact hole is increased. The increase in the aspect ratio of the hole makes it difficult to deposit a metal layer within the hole by the sputtering method to form the metal plug.

In place of the sputtering method, a chemical vapor deposition method has recently been attracted due to its good step coverage. If the chemical vapor deposition method is used, tungsten as a refractory metal is deposited to fill the hole. If tungsten is deposited by the chemical vapor deposition, not only the tungsten plug is deposited within the hole in the inter-layer insulator but also an unnecessary tungsten layer is deposited over the inter-layer insulator. The unnecessary tungsten layer is then removed by a chemical mechanical polishing method.

If the chemical vapor deposition method and the subsequent chemical mechanical polishing method are carried out, then a seam is formed, wherein a cavity is formed which extends along a center line of the tungsten plug. The formation of the seam deeply depends upon the manufacturing processes for forming the tungsten plug, for which reason the conventional method of forming the tungsten plug will subsequently be described in detail by taking an example of the tungsten plug being formed in the through hole. FIGS. 1A through 1F are fragmentary cross sectional elevation views illustrative of semiconductor devices with tungsten plugs in the through holes formed in the inter-layer insulators in sequential steps involved in the conventional method of forming the semiconductor device.

With reference to FIG. 1A, a base oxide layer 1 is formed on a surface of a semiconductor substrate which is not illustrated, wherein one or more semiconductor devices are formed on the surface of the semiconductor substrate. A first aluminum interconnection layer is formed on a top surface of the base oxide layer 1. The first aluminum interconnection layer is patterned by a photo-lithography process and a subsequent dry etching process to form plural first level interconnections 2 on the top surface of the base oxide layer 1.

With reference to FIG. 1B, a first inter-layer insulator 3 is entirely deposited over the first level interconnections 2 and the base oxide layer 1 so that the first level interconnections 2 are completely buried in the first inter-layer insulator 3. A top surface of the first inter-layer insulator 3 is planarized by a chemical mechanical polishing method to form a planarized of surface of the first inter-layer insulator 3.

With reference to FIG. 1C, through holes 4 are formed in the first inter-layer insulator 3 by a photo-lithography and a subsequent dry etching process so that the through holes 4 reach top surfaces of the first level interconnections 2, whereby parts of the first level interconnections 2 are shown through the through holes 4.

With reference to FIG. 1D, a thin titanium nitride film as a barrier layer not illustrated is entirely deposited by a sputtering method, so that the thin titanium nitride film extends on the top surface of the first inter-layer insulator 3, side walls of the through holes 4 and bottoms of the through holes 4. This thin titanium nitride film serves as a barrier layer which improves an adhesiveness between silicon oxide and tungsten Subsequently, a thin tungsten core film is grown from micro crystals of tungsten by a chemical vapor deposition method on the thin titanium nitride film as a barrier layer, so that the thin tungsten core film is formed from the micro crystals of tungsten and the thin tungsten core film extends entirely on the thin titanium nitride film as a barrier layer. The micro crystals of tungsten serve as seeds or cores to be grown up and become the thin tungsten core film. In the process of forming the micro crystals of tungsten, the chemical vapor deposition process is carried out by utilizing a reduction reaction of $WF_6$ with $SiH_4$, wherein a reaction rate is low. When the thin tungsten core film is grown to have a thickness of about 500 angstroms, then the current growth is discontinued. This thin tungsten core film serves as a core for a further growth to a bulk tungsten layer. After the thin tungsten core film has been grown, then the used Source gases of the chemical vapor deposition is changed to $WF_6$ and $H_2$, so that another chemical vapor deposition is carried out by utilizing another reduction reaction of $WP_6$ with $H_2$, wherein the reaction rate is high so that a tungsten layer 7 is grown from the thin tungsten core film, whereby the tungsten layer 7 extends within the through holes 4 and on the top surface of the first inter-layer insulator 3. As a result, the through holes 4 are completely filled with the tungsten layer 7.

With reference to FIG. 1E, the tungsten layer 7 and the barrier layer, which extend over the top surface of the first inter-layer insulator 3, are removed by a chemical mechanical polishing method, so that the tungsten layer 7 and the barrier layer remain only within the through holes 4, whereby tungsten plugs 9 are formed within the through holes 4. Tops of the tungsten plugs 9 within the through holes 4 are leveled to the top surface of the first inter-layer insulator 3.

With reference to FIG. 1F, a second aluminum interconnection layer is formed on the top surface of the first inter-layer insulator 3 and on the tops of the tungsten plugs 9 within the through holes 4. The second aluminum interconnection layer is patterned by a photo-lithography process and a subsequent dry etching process to form plural second level interconnections 6 on the tops of the tungsten plugs 9 within the through holes 4, so that the second level interconnections 6 are electrically connected to the first level interconnections 2 through the tungsten plugs 9 within the through holes 4.

The growth mechanism of growing the bulk tungsten layer 7 from the thin tungsten core film will again be described in detail with reference again to FIG. 1D. In an initial stage of the growth, the thin tungsten core film is grown on the inside walls of the through holes 4. This makes it easy to supply the source gases of the chemical vapor deposition into spaces of the through holes 4, whereby the growth of the tungsten layer is progressed satisfactorily or smoothly. As the growth of the tungsten layer is progressed and the tungsten layers within the through holes 4 become thick, whereby the spaces of the through holes 4 are narrowed, thereby making it difficult to supply the source gases of the chemical vapor deposition into the narrowed spaces of the through holes 4. This means that if the spaces of the through holes 4 are narrowed together with the growth of the tungsten layers on the side walls of he through holes 4, then this makes it difficult to supply the source gases of the chemical vapor deposition into the narrowing spaces of the through holes 4, whereby the growth rate of the tungsten layer by the chemical vapor deposition is reduced. In a final stage of filling the through holes 4 with the tungsten layers 7, the growth rate of the tungsten layer by the chemical vapor deposition is almost zero. Namely, the micro crystal structure of tungsten in the vicinity of the center lines of the through holes 4 is like that the micro crystals are not bonded rather are in contact with each other. This means that many micro crystal defects 10 of the micro crystal of the tungsten layers 7 within the through holes 4 are formed along the center lines of the through holes 4.

The mechanism of the subsequent chemical mechanical polishing method will be described with reference again to FIG. 1E. The mechanism of the subsequent chemical mechanical polishing to the tungsten layer is that polishing particles shave oxidized tungsten by an oxidizing agent of hydrogen peroxide included in a polishing agent. Hydrogen peroxide as the oxidizing agent may, however, enter along the crystal defects 10 of the micro crystal of the tungsten layers 7 within the through holes 4, whereby the oxidation of the tungsten layer appears not only on the top surface of the tungsten layer 7 but also along the crystal defects 10 of the micro crystal of the tungsten layers 7 within the through holes 4. As a result, the oxidized tungsten not only on the top surface of the tungsten layer 7 but also along the crystal defects 10 are removed by the chemical mechanical polishing process, whereby not only the tungsten layer 7 over the top surface of the first inter-layer insulator 3 but also the tungsten layer 7 in the vicinity of the crystal defects 10 of the micro crystal of the tungsten layers 7 within the through holes 4 are removed. As a result, cavities 8 are formed along the center lines of the tungsten plugs 9 within the through holes 4. Once micro cavities have been formed, then the polishing agents also enter into the micro cavities and a contact area between the polishing agents and the tungsten layers 7 is increased, the cavities 8 in the tungsten plugs 9 are rapidly enlarged. These cavities 8 are also so called to as seams 8. Foreign matters or extraneous materials are likely to be received within the seams 8 of the tungsten plugs 9 in the through holes 4. It may be possible that a different film is formed over the tungsten layer 9 whereby a temperature is increased. In this case, not only a problem with contact failure is raised but also another problem is raised like that a moisture adhered in an inside face of the seam 8 is rapidly evaporated to cause an expansion of the film or peeling the film.

In the above circumstances, it had been required to develop a novel method of forming tungsten plugs in holes formed in an inter-layer insulator of a semiconductor device free from the above problem.

SUMMARY OF THE INVENTION

Accordingly, it is an object of the present invention to provide a novel method of forming tungsten plugs in a holes formed in an inter-layer insulator of a semiconductor device free from the above problems.

It is a further object of the present invention to provide a novel method of forming tungsten plugs in holes formed in an inter-layer insulator of a semiconductor device, wherein no seam is formed along center lines of the tungsten plugs in a chemical mechanical polishing process for forming the tungsten plugs in the holes.

It is a still further object of the present invention to provide a novel method of forming tungsten plugs in holes formed in an inter-layer insulator of a semiconductor device, wherein a yield of the semiconductor device is improved.

The first present invention provides a method of forming a tungsten layer having a high film density, which at least fills a hole of an insulation layer. The method comprises the steps of: carrying out a first chemical vapor deposition process for growing a micro crystal tungsten thin film on at least an inside face of the hole; and carrying our a second chemical vapor deposition process for growing a tungsten layer from the micro crystal tungsten thin film so that the tungsten layer at least fills the hole, wherein the second chemical vapor deposition process is carried out at a substrate temperature of not less than 475° C. and at a growth chamber pressure in the range of 90 Torr to 150 Torr, so that the tungsten layer has a high film density and a reduced film stress.

The second present invention provides a method of forming a tungsten plug in a hole of an insulation layer The method comprises the steps of: carrying out a first chemical vapor deposition process for growing a micro crystal tungsten thin film on at least an inside face of the hole, carrying our a second chemical vapor deposition process for growing a tungsten layer from the micro crystal tungsten thin film so that the tungsten layer fills the hole and also extends over a top surface of the insulation layer; and carrying out a chemical mechanical polishing process for selectively removing the tungsten layer over the top surface of the insulation layer and leaving the tungsten layer in the hole, thereby to form a tungsten plug in the hole, wherein the second chemical vapor deposition process is carried out at a substrate temperature of not less than 475° C. and at a growth chamber pressure in the range of 90 Torr to 150 Torr, so that the tungsten layer has a high film density.

The third present invention provides a method of forming a tungsten plug in a hole of an inter-layer insulator. The method comprises the steps of: forming at least a hole in an inter-layer insulator; forming a thin barrier layer on at least an inside face of a hole; carrying out a first chemical vapor deposition process for growing a micro crystal tungsten thin film on the thin barrier layer; carrying our a second chemical vapor deposition process for growing a tungsten layer from the micro crystal tungsten thin film so that the tungsten layer fills the hole and also extends over a top surface of the inter-layer insulator; and carrying out a chemical mechanical polishing process for selectively removing the tungsten layer over the top surface of the inter-layer insulator and leaving the tungsten layer in the hole, thereby to form a tungsten plug in the hole, wherein the second chemical vapor deposition process is carried out at a substrate temperature of not less than 475° C. and at a growth chamber pressure in the range of 90 Torr to 150 Torr, so that the tungsten layer has a high film density.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1A:
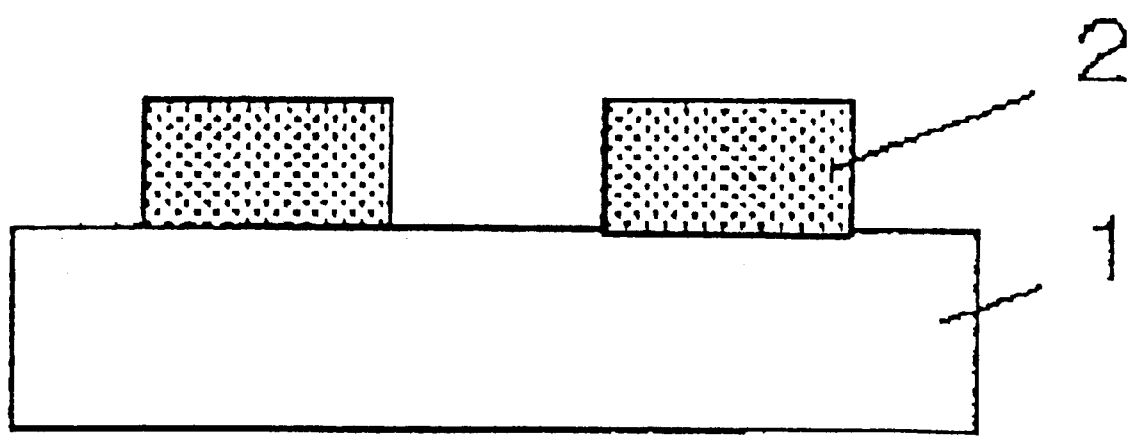
FIGS. 1A through 1F are fragmentary cross sectional elevation views illustrative of semiconductor devices with tungsten plugs in the through holes formed in the inter-layer insulators in sequential steps involved in the conventional method of forming the semiconductor device.
Figure 1B:
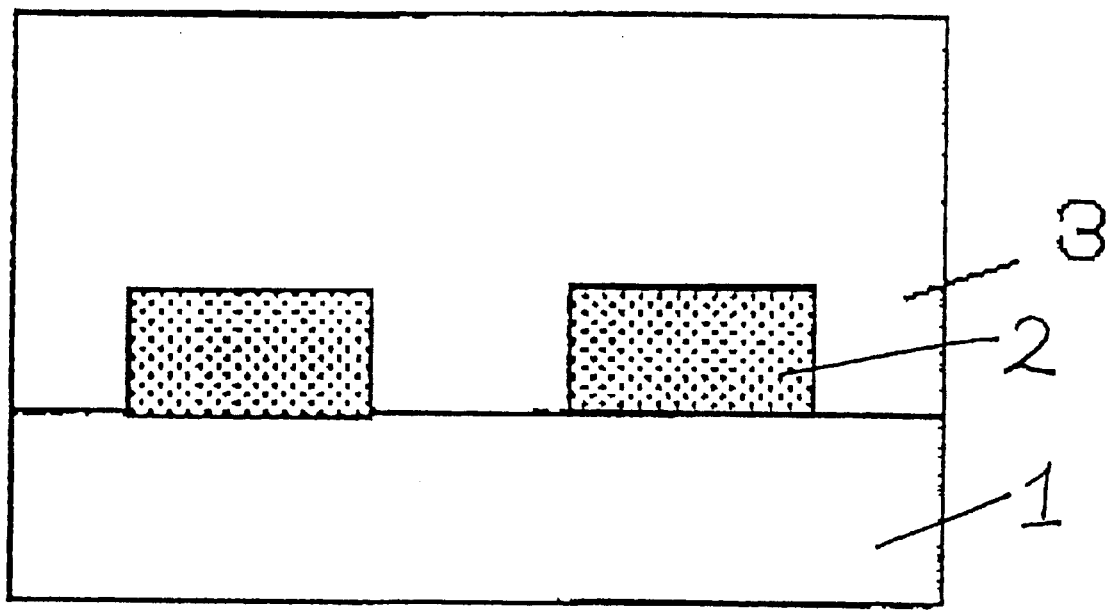
Figure 1C:
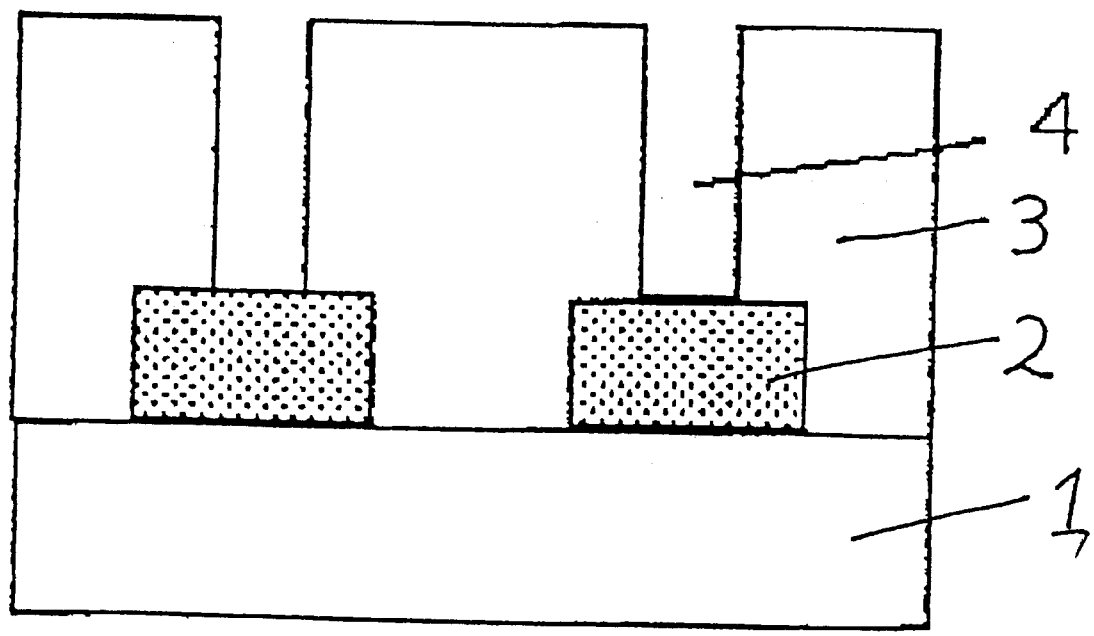
Figure 1D:
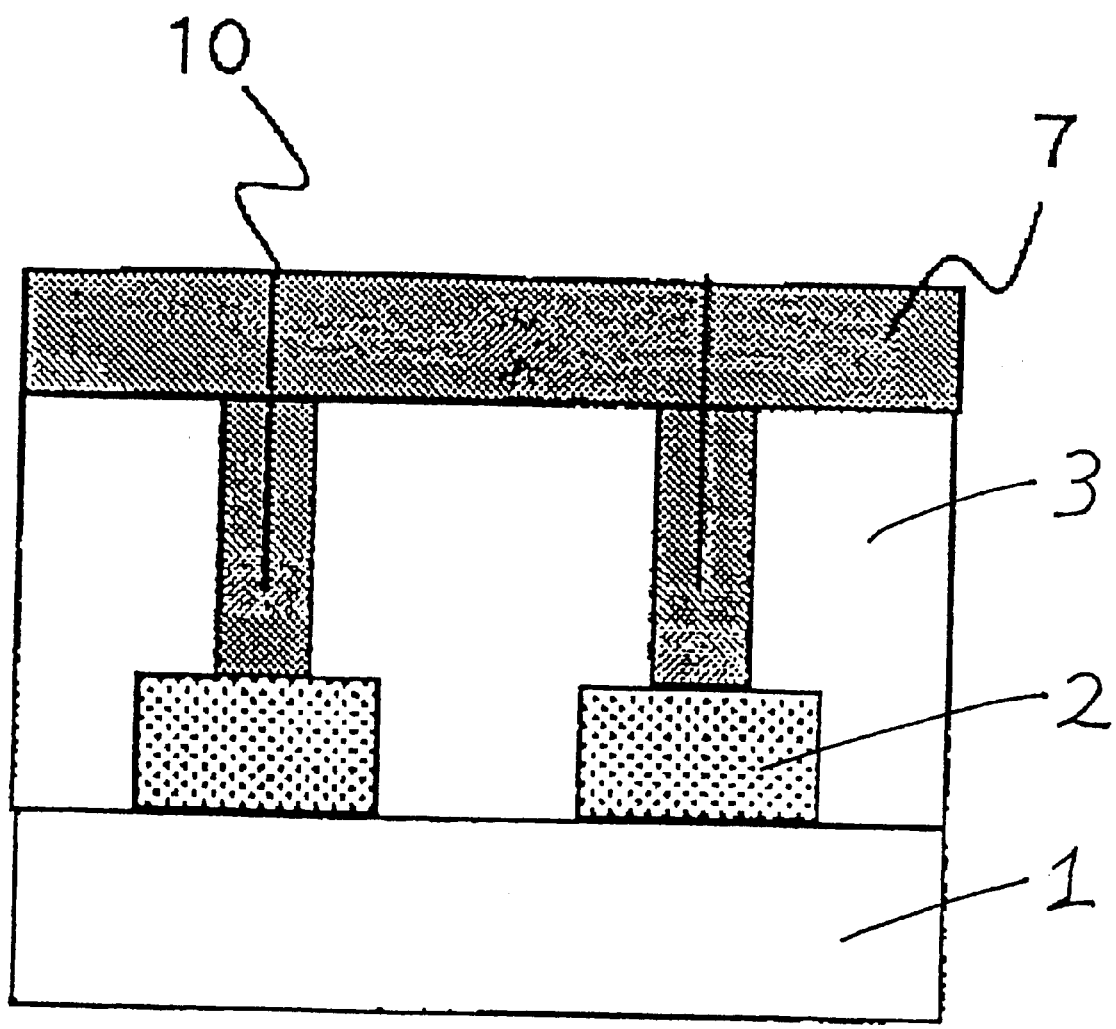
Figure 1E:
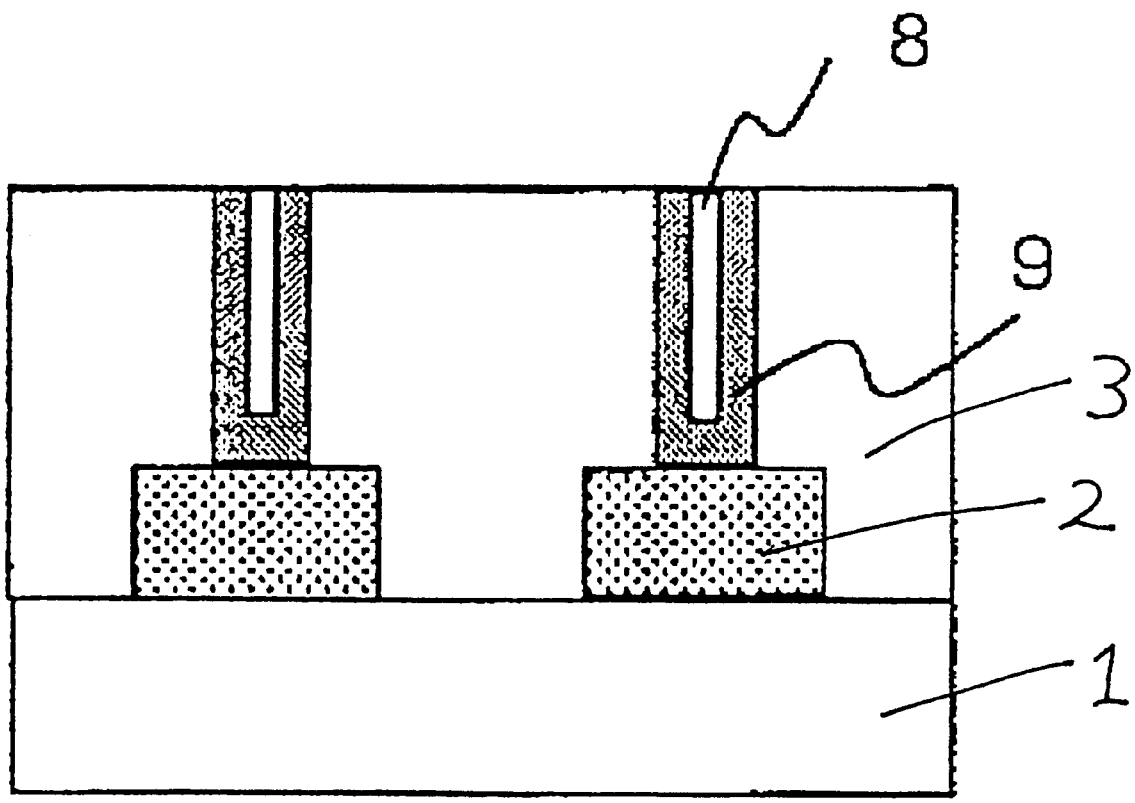
Figure 1F:
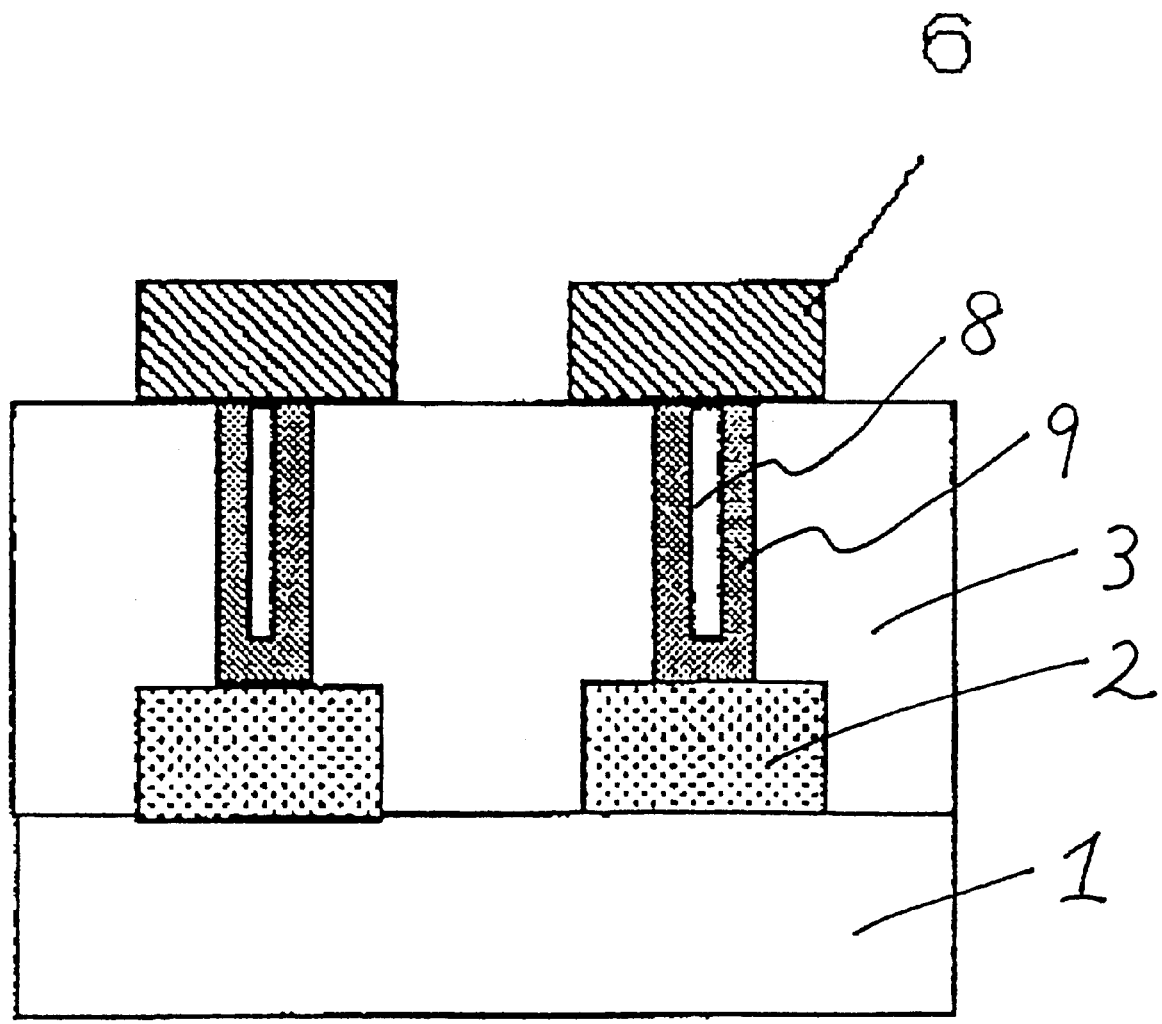

The first present invention provides a method of forming a tungsten layer having a high film density, which at least fills a hole of an insulation layer. The method comprises the steps of: carrying out a first chemical vapor deposition process for growing a micro crystal tungsten thin film on at least an inside face of the hole; and carrying our a second chemical vapor deposition process for growing a tungsten layer from the micro crystal tungsten thin film so that the tungsten layer at least fills the hole, wherein the second chemical vapor deposition process is carried out at a substrate temperature of not less than 475° C. and at a growth chamber pressure in the range of 90 Torr to 150 Torr, so that the tungsten layer has a high film density and a reduced film stress.

It is important for the present invention that the tungsten layer has a high film density. If the film density of the tungsten layer is high, then it is possible to suppress formation of crystal defects or crystal failures along a center line of the tungsten layer in the hole. No crystal defect formation along the center line of the tungsten layer prevents formation of seam along the center line of the tungsten layer in the hole during a subsequent chemical mechanical polishing process. It is also important for the present invention that the tungsten layer has a reduced film stress.

In order to obtain the tungsten layer in the hole, which has a sufficiently high film density for suppressing formation of seam along a center line of the tungsten layer in the hole during a subsequent chemical mechanical polishing process, it is important that the second chemical vapor deposition process is carried out at a substrate temperature of not less than 475° C. and at a growth chamber pressure of not less than 90 Torr. If the second chemical vapor deposition process is carried out at a substrate temperature of not less than 475° C. and at a growth chamber pressure of not less than 90 Torr, then a growth rate of the tungsten layer from the micro crystal tungsten thin film is slower than the conventional temperature and pressure conditions of the second chemical vapor deposition process. The substrate temperature and the growth chamber pressure of the second chemical vapor deposition process in accordance with the present invention are higher than the conventional conditions of the substrate temperature and the growth chamber pressure of the second chemical vapor deposition process. The above novel conditions for the high substrate temperature and the high growth chamber pressure of the second chemical vapor deposition process cause that the tungsten crystal density of the tungsten layer formed by the chemical vapor deposition is so high as suppressing the formation of crystal defects along the center line of the tungsten layer in the hole, and also cause that even when the tungsten layer in the hole is grown to narrow an inner space of the hole, a sufficient amount of the source gas is supplied to a growing surface of the tungsten layer. A sufficient suppression to formation of the crystal defects alone the center line of the tungsten layer in the hole causes that no seam is formed along the center line of the tungsten layer in the hole during a chemical mechanical polishing process to be carried out after the second chemical vapor deposition process. The mechanism of the subsequent chemical mechanical polishing to the tungsten layer is that tungsten is oxidized by an oxidizing agent of hydrogen peroxide included in a polishing agent so that the oxidized part of the tungsten layer is then shaved by polishing particles. Hydrogen peroxide as the oxidizing agent is in contact with only a top surface of the tungsten layer. However, the suppression to the formation of the crystal defects along the center line of the tungsten layer in the hole prevents hydrogen peroxide as the oxidizing agent from entering into the tungsten layer in the hole, whereby oxidation of the tungsten layer appears but only on the top surface of the tungsten layer. Namely, no oxidation is caused in the tungsten layer in the hole. As a result, the oxidized tungsten on the top surface of the tungsten layer is removed by the chemical mechanical polishing process, whereby the tungsten layer only over the top surface of the insulation layer is removed, whilst the tungsten layer in the hole is not removed. As a result, no seam is formed along the center line of the tungsten layer in the hole. No foreign matters nor extraneous materials enter into the tungsten layer in the hole. No different film is formed over the tungsten layer in the hole, whereby there are raised no problem with contact failure nor problem that a moisture adhered in an inside face of the scam is rapidly evaporated to cause an expansion of the film or peeling the film.

Also, in order to obtain the tungsten layer in the hole, which has a reduced film stress, it is important that the second chemical vapor deposition process is carried out at a growth chamber pressure of not more than 150 Torr. If the growth chamber pressure of the second chemical vapor deposition process exceeds 150 Torr, then a large stress is applied to the tungsten film deposited by the second chemical vapor deposition process. In order to reduce the stress of the tungsten film, it is preferable that the growth chamber pressure of the second chemical vapor deposition process is controlled to be not more than 150 Torr.

It is preferable that the insulation layer comprises an inter-layer insulator extending over a top surface of a semiconductor substrate, and the top surface of a semiconductor substrate has at least a semiconductor device, and the hole comprises a contact hole which reaches the semiconductor device. In this case, it is further preferable that the substrate temperature in the second chemical vapor deposition process is maintained at not more than 600° C. Before the second chemical vapor deposition process is carried out, any interconnection has not yet been formed. Namely, an aluminum interconnection, which is thermally unstable, has not yet been formed, when the second chemical vapor deposition process is carried out. The upper limit of the substrate temperature of the second chemical vapor deposition process is increased up to 600° C. The increase in the substrate temperature of the second chemical vapor deposition process causes a further increase in the film density of the tungsten layer deposited by the second chemical vapor deposition process. The further increase in the film density of the tungsten layer emphasizes the effect of suppressing formation of the crystal defects along the center line of the tungsten layer in the hole, whereby the effect of suppressing formation of the scam along the tungsten layer in the hole is emphasized.

It is also preferable that the insulation layer comprises an inter-layer insulator extending over at least a lower level interconnection, and the hole comprises a through hole which reaches the lower level interconnection. If the lower level interconnection comprises an aluminum interconnection, then it is further preferable that the substrate temperature in the second chemical vapor deposition process is maintained in the range of 475° C. to 495° C. in order to avoid any substantive damage to the aluminum interconnection. The aluminum interconnection is thermally unstable, for which reason if the substrate temperature of the second chemical vapor deposition process is above 495° C., it is possible that the aluminum interconnection receives a substantive damage. Namely, if the substrate temperature of the second chemical vapor deposition process is controlled in the range of 475° C. to 495° C., the tungsten layer with the required high film density is formed without providing any substantive damage to the aluminum interconnection.

It is also preferable that the growth chamber pressure in the second chemical vapor deposition process is maintained in the range of 100 Torr to 150 Torr.

It is also preferable that a flow rate of $WF_6$ source gas in the second chemical vapor deposition process is maintained in the range of 50 sccm to 100 sccm. The flow rate of the source gas of the novel second chemical vapor deposition process of the present invention is lower than the conventional second chemical vapor deposition process. The reduction in the flow rate of the source gas of the second chemical vapor deposition process results in the reduction in the growth rate of the tungsten layer, whereby the film density of the tungsten layer is increased. If the flow rate of $WF_6$ source gas in the second chemical vapor deposition process is controlled to be not more than 100 sccm, then the growth rate of the tungsten layer is sufficiently low and the film density of the tungsten layer is increased. The increase in the film density of the tungsten layer emphasizes the effect of suppressing formation of the crystal defects along the center line of the tungsten layer in the hole, whereby the effect of suppressing formation of the seam along the tungsten layer in the hole is emphasized. If the growth rate of the tungsten layer is less than 50 sccm, then the growth rate is so slow as the practical condition in view of the productivity For the above reasons, it is preferable that the flow rate of $WF_6$ source gas in the second chemical vapor deposition process is maintained in the range of 50 sccm to 100 sccm.

It is also preferable that a growth rate of the second chemical vapor deposition process is maintained at about 2000 angstroms per second.

It is also preferable that the first chemical vapor deposition process is carried out at a substrate temperature which is lower than the second chemical vapor deposition process.

It is also preferable that the micro crystal tungsten thin film has a thickness of about 500 angstroms.

It is also preferable that the tungsten layer extends not only in the hole but also over a top surface of the insulation layer. In this case, it is also preferable to further comprise a step of carrying out a chemical mechanical polishing process, after the second chemical vapor deposition process, for selectively removing the tungsten layer over the top surface of the insulation layer and leaving the tungsten layer in the hole, thereby to form a tungsten plug in the hole. It is further preferable that the chemical mechanical polishing process is carried out by use of a polishing agent added with an oxidizing agent, since the film density of the tungsten layer is sufficiently high for suppressing the formation of the crystal defects along the center line of the tungsten film in the hole. Tungsten is oxidized by an oxidizing agent of hydrogen peroxide included in a polishing agent so that the oxidized part of the tungsten layer is then shaved by polishing particles. Hydrogen peroxide as the oxidizing agent is in contact with only a top surface of the tungsten layer. However, the suppression to the formation of the crystal defects along the center line of the tungsten layer in the hole prevents hydrogen peroxide as the oxidizing agent from entering into the tungsten layer in the hole, whereby oxidation of the tungsten layer appears but only on the top surface of the tungsten layer. Namely, no oxidation is caused in the tungsten layer in the hole. As a result, the oxidized tungsten on the top surface of the tungsten layer is removed by the chemical mechanical polishing process, whereby the tungsten layer only over the top surface of the insulation layer is removed, whilst the tungsten layer in the hole is not removed. As a result, no seam is formed along the center line of the tungsten layer in the hole. No foreign matters nor extraneous materials enter into the tungsten plug in the hole. No different film is formed over the tungsten plug in the hole, whereby there are raised no problem with contact failure nor problem that a moisture adhered in an inside face of the seam is rapidly evaporated to cause an expansion of the film or peeling the film.

It is also preferable to further comprise a step of forming a thin barrier layer on at least the inside face of the hole before the first chemical vapor deposition process is then carried out to form the micro crystal tungsten thin film on the thin barrier layer. It is further preferable that the barrier layer comprises one of a TiN layer, a TiW layer and a Ti/TiN layer The barrier layer improves the adhesiveness between the insulation layer or the inter-layer insulator and the tungsten film.

The second present invention provides a method of forming a tungsten plug in a hole of an insulation layer. The method comprises the steps of: carrying out a first chemical vapor deposition process for growing a micro crystal tungsten thin film on at least an inside face of the hole; carrying our a second chemical vapor deposition process for growing a tungsten layer from the micro crystal tungsten thin film so that the tungsten layer fills the hole and also extends over a top surface of the insulation layer; and carrying out a chemical mechanical polishing process for selectively removing the tungsten layer over the top surface of the insulation layer and leaving the tungsten layer in the hole, thereby to form a tungsten plug in the hole, wherein the second chemical vapor deposition process is carried out at a substrate temperature of not less than 475° C. and at a growth chamber pressure in the range of 90 Torr to 150 Torr, so that the tungsten layer has a high film density.

It is important for the present invention that the tungsten layer or the tungsten plug in the hole has a high film density. If the film density of the tungsten layer is high, then it is possible to suppress formation of crystal defects or crystal failures along a center line of the tungsten layer in the hole. No crystal defect formation along the center line of the tungsten layer prevents formation of seam along the center line of the tungsten layer or the tungsten plug in the hole during a subsequent chemical mechanical polishing process. It is also important for the present invention that the tungsten layer or the tungsten plug has a reduced film stress.

In order to obtain the tungsten layer in the hole, which has a sufficiently high film density for suppressing formation of seam along a center line of the tungsten layer in the hole during a subsequent chemical mechanical polishing process, it is important that the second chemical vapor deposition process is carried out at a substrate temperature of not less than 475° C. and at a growth chamber pressure of not less than 90 Torr. If the second chemical vapor deposition process is carried out at a substrate temperature of not less than 475° C. and at a growth chamber pressure of not less than 90 Torr, then a growth rate of the tungsten layer from the micro crystal tungsten thin film is slower than the conventional temperature and pressure conditions of the second chemical vapor deposition process. The substrate temperature and the growth chamber pressure of the second chemical vapor deposition process in accordance with the present invention are higher than the conventional conditions of the substrate temperature and the growth chamber pressure of the second chemical vapor deposition process. The above novel conditions for the high substrate temperature and the high growth chamber pressure of the second chemical vapor deposition process cause that the tungsten crystal density of the tungsten layer formed by the chemical vapor deposition is so high as suppressing the formation of crystal defects along the center line of the tungsten layer in the hole, and also cause that even when the tungsten layer in the hole is grown to narrow an inner space of the hole, a sufficient amount of the source gas is supplied to a growing surface of the tungsten layer. A sufficient suppression to formation of the crystal defects along the center line of the tungsten layer in the hole causes that no seam is formed along the center line of the tungsten layer in the hole during a chemical mechanical polishing process to be carried out after the second chemical vapor deposition process. The mechanism of the subsequent chemical mechanical polishing to the tungsten layer is that tungsten is oxidized by an oxidizing agent of hydrogen peroxide included in a polishing agent so that the oxidized part of the tungsten layer is then shaved by polishing particles. Hydrogen peroxide as the oxidizing agent is in contact with only a top surface of the tungsten layer. However, the suppression to the formation of the crystal defects along the center line of the tungsten layer in the hole prevents hydrogen peroxide as the oxidizing agent from entering into the tungsten layer in the hole, whereby oxidation of the tungsten layer appears but only on the top surface of the tungsten layer. Namely, no oxidation is caused in the tungsten layer in the hole. As a result, the oxidized tungsten on the top surface of the tungsten layer is removed by the chemical mechanical polishing process, whereby the tungsten layer only over the top surface of the insulation layer is removed, whilst the tungsten layer in the hole is not removed. As a result, no seam is formed along the center line of the tungsten layer in the hole. No foreign matters nor extraneous materials enter into the tungsten plug in the hole. No different film is formed over the tungsten plug in the hole, whereby there are raised no problem with contact failure nor problem that a moisture adhered in an inside face of the seam is rapidly evaporated to cause an expansion of the film or peeling the film.

Also, in order to obtain the tungsten layer in the hole, which has a reduced film stress, it is important that the second chemical vapor deposition process is carried out at a growth chamber pressure of not more than 150 Torr. If the growth chamber pressure of the second chemical vapor deposition process exceeds 150 Torr, then a large stress is applied to the tungsten film deposited by the second chemical vapor deposition process. In order to reduce the stress of the tungsten film, it is preferable that the growth chamber pressure of the second chemical vapor deposition process is controlled to be not more than 150 Torr.

It is preferable that the insulation layer comprises an inter-layer insulator extending over a top surface of a semiconductor substrate, and the top surface of a semiconductor substrate has at least a semiconductor device, and the hole comprises a contact hole which reaches the semiconductor device. In this case, it is further preferable that the substrate temperature in the second chemical vapor deposition process is maintained at not more than 600° C. Before the second chemical vapor deposition process is carried out, any interconnection has not yet been formed. Namely, an aluminum interconnection, which is thermally unstable, has not yet been formed, when the second chemical vapor deposition process is carried out. The upper limit of the substrate temperature of the second chemical vapor deposition process is increased up to 600° C. The increase in the substrate temperature of the second chemical vapor deposition process causes a further increase in the film density of the tungsten layer deposited by the second chemical vapor deposition process. The further increase in the film density of the tungsten layer emphasizes the effect of suppressing formation of the crystal defects along the center line of the tungsten layer in the hole, whereby the effect of suppressing formation of the seam along the tungsten layer in the hole is emphasized.

It is also preferable that the insulation layer comprises an inter-layer insulator extending over at least a lower level interconnection, and the hole comprises a through hole which reaches the lower level interconnection. If the lower level interconnection comprises an aluminum interconnection, then it is further preferable that the substrate temperature in the second chemical vapor deposition process is maintained in the range of 475° C. to 495° C. in order to avoid any substantive damage to the aluminum interconnection. The aluminum interconnection is thermally unstable, for which reason if the substrate temperature of the second chemical vapor deposition process is above 495° C., it is possible that the aluminum interconnection receives a substantive damage. Namely, if the substrate temperature of the second chemical vapor deposition process is controlled in the range of 475° C. to 495° C., the tungsten layer with the required high film density is formed without providing any substantive damage to the aluminum interconnection.

It is also preferable that the growth chamber pressure in the second chemical vapor deposition process is maintained in the range of 100 Torr to 150 Torr. The growth chamber pressure of the novel second chemical vapor deposition process is higher than the conventional vapor deposition process. The increase in the growth chamber pressure of the novel second chemical vapor deposition process increases the film density of the tungsten layer deposited by the novel second chemical vapor deposition process. The increase in the film density of the tungsten layer emphasizes the effect of suppressing formation of the crystal defects along the center line of the tungsten layer in the hole, whereby the effect of suppressing formation of the seam along the tungsten layer in the hole is emphasized.

It is also preferable that a flow rate of $WF_6$ source gas in the second chemical vapor deposition process is maintained in the range of 50 sccm to 100 sccm. The flow rate of the source gas of the novel second chemical vapor deposition process of the present invention is lower than the conventional second chemical vapor deposition process. The reduction in the flow rate of the source gas of the second chemical vapor deposition process results in the reduction in the growth rate of the tungsten layer, whereby the film density of the tungsten layer is increased. If the flow rate of $WF_6$ source gas in the second chemical vapor deposition process is controlled to be not more than 100 sccm, then the growth rate of the tungsten layer is sufficiently low and the film density of the tungsten layer is increased. The increase in the film density of the tungsten layer emphasizes the effect of suppressing formation of the crystal defects along the center line of the tungsten layer in the hole, whereby the effect of suppressing formation of the seam along the tungsten layer in the hole is emphasized. If the growth rate of the tungsten layer is less than 50 sccm, then the growth rate is so slow as the practical condition in view of the productivity. For the above reasons, it is preferable that the flow rate of $WF_6$ source gas in the second chemical vapor deposition process is maintained in the range of 50 sccm to 100 sccm.

It is also preferable that a growth rate of the second chemical vapor deposition process is maintained at about 2000 angstroms per second.

It is also preferable that the fist chemical vapor deposition process is carried out at a substrate temperature which is lower than the second chemical vapor deposition process.

It is also preferable that the micro crystal tungsten thin film has a thickness of about 500 angstroms It is also preferable that the chemical mechanical polishing process is carried out by use of a polishing agent added with an oxidizing agent since the film density of the tungsten layer is sufficiently high for suppressing the formation of the crystal defects along the center line of the tungsten film in the hole. Tungsten is oxidized by an oxidizing agent of hydrogen peroxide included in a polishing agent so that the oxidized part of the tungsten layer is then shaved by polishing particles. Hydrogen peroxide as the oxidizing agent is in contact with only a top surface of the tungsten layer. However, the suppression to the formation of the crystal defects along the center line of the tungsten layer in the hole prevents hydrogen peroxide as the oxidizing agent from entering into the tungsten layer in the hole, whereby oxidation of the tungsten layer appears but only on the top surface of the tungsten layer. Namely, no oxidation is caused in the tungsten layer in the hole. As a result, the oxidized tungsten on the top surface of the tungsten layer is removed by the chemical mechanical polishing process, whereby the tungsten layer only over the top surface of the insulation layer is removed, whilst the tungsten layer in the hole is not removed. As a result, no scam is formed along the center line of the tungsten layer in the hole. No foreign matters nor extraneous materials enter into the tungsten plug in the hole. No different film is formed over the tungsten plug in the hole, whereby there are raised no problem with contact failure nor problem that a moisture adhered in an inside face of the seam is rapidly evaporated to cause an expansion of the film or peeling the film.

It is also preferable to further comprise a step of forming a thin barrier layer on at least the inside face of the hole before the first chemical vapor deposition process is then carried out to form the micro crystal tungsten thin film on the thin barrier layer. In this case, it is further preferable that the barrier layer comprises one of a TiN layer, a TiW layer and a Ti/TiN layer. The barrier layer improves the adhesiveness between the insulation layer or the inter-layer insulator and the tungsten film.

The third present invention provides a method of forming a tungsten plug in a hole of an inter-layer insulator. The method comprises the steps of: forming at least a hole in an inter-layer insulator; forming a thin barrier layer on at least an inside face of a hole; carrying out a first chemical vapor deposition process for growing a micro crystal tungsten thin film on the thin barrier layer; carrying our a second chemical vapor deposition process for growing a tungsten layer from the micro crystal tungsten thin film so that the tungsten layer fills the hole and also extends over a top surface of the inter-layer insulator; and carrying out a chemical mechanical polishing process for selectively removing the tungsten layer over the top surface of the inter-layer insulator and leaving the tungsten layer in the hole, thereby to form a tungsten plug in the hole, wherein the second chemical vapor deposition process is carried out at a substrate temperature of not less than 475° C. and at a growth chamber pressure in the range of 90 Torr to 150 Torr, so that the tungsten layer has a high film density.

It is important for the present invention that the tungsten layer or the tungsten plug in the hole has a high film density. If the film density of the tungsten layer is high, then it is possible to suppress formation of crystal defects or crystal failures along a center line of the tungsten layer in the hole. No crystal defect formation along the center line of the tungsten layer prevents formation of seam along the center line of the tungsten layer or the tungsten plug in the hole during a subsequent chemical mechanical polishing process. It is also important for the present invention that the tungsten layer or the tungsten plug has a reduced film stress.

In order to obtain the tungsten layer in the hole, which has a sufficiently high film density for suppressing formation of seam along a center line of the tungsten layer in the hole during a subsequent chemical mechanical polishing process, it is important that the second chemical vapor deposition process is earned out at a substrate temperature of not less than 475° C. and at a growth chamber pressure of not less than 90 Torr. If the second chemical vapor deposition process is carried out at a substrate temperature of not less than 475° C. and at a growth chamber pressure of not less than 90 Torr, then a growth rate of the tungsten layer from the micro crystal tungsten thin film is slower than the conventional temperature and pressure conditions of the second chemical vapor deposition process. The substrate temperature and the growth chamber pressure of the second chemical vapor deposition process in accordance with the present invention are higher than the conventional conditions of the substrate temperature and the growth chamber pressure of the second chemical vapor deposition process. The above novel conditions for the high substrate temperature and the high growth chamber pressure of the second chemical vapor deposition process cause that the tungsten crystal density of the tungsten layer formed by the chemical vapor deposition is so high as suppressing the formation of crystal defects along the center line of the tungsten layer in the hole, and also cause that even when the tungsten layer in the hole is grown to narrow an inner space of the hole, a sufficient amount of the source gas is supplied to a growing surface of the tungsten layer. A sufficient suppression to formation of the crystal defects along tho center line of the tungsten layer in the hole causes that no seam is formed along the center line of the tungsten layer in the hole during a chemical mechanical polishing process to be carried out after the second chemical vapor deposition process. The mechanism of the subsequent chemical mechanical polishing to the tungsten layer is that tungsten is oxidized by an oxidizing agent of hydrogen peroxide included in a polishing agent so that the oxidized part of the tungsten layer is then shaved by polishing particles. Hydrogen peroxide as the oxidizing agent is in contact with only a top surface of the tungsten layer. However, the suppression to the formation of the crystal defects along the center line of the tungsten layer in the hole prevents hydrogen peroxide as the oxidizing agent from entering into the tungsten layer in the hole, whereby oxidation of the tungsten layer appears but only on the top surface of the tungsten layer. Namely, no oxidation is caused in the tungsten layer in the hole. As a result, the oxidized tungsten on the top surface of the tungsten layer is removed by the chemical mechanical polishing process, whereby the tungsten layer only over the top surface of the insulation layer is removed, whilst the tungsten layer in the hole is not removed. As a result, no seam is formed along the center line of the tungsten layer in the hole. No foreign matters nor extraneous materials enter into the tungsten plug in the hole. No different film is formed over the tungsten plug in the hole, whereby there are raised no problem with contact failure nor problem that a moisture adhered in an inside face of the seam is rapidly evaporated to cause an expansion of the film or peeling the film.

Also, in order to obtain the tungsten layer in the hole, which has a reduced film stress, it is important that the second chemical vapor deposition process is carried out at a growth chamber pressure of not more than 150 Torr. If the growth chamber pressure of the second chemical vapor deposition process exceeds 150 Torr, then a large stress is applied to the tungsten film deposited by the second chemical vapor deposition process. In order to reduce the stress of the tungsten film, it is preferable that the growth chamber pressure of the second chemical vapor deposition process is controlled to be not more than 150 Torr.

It is preferable that the inter-layer insulator extends over a top surface of a semiconductor substrate, and the top surface of the semiconductor substrate has at least a semiconductor device, and the hole comprises a contact hole which reaches the semiconductor device. In this case, it is further preferable that the substrate temperature in the second chemical vapor deposition process is maintained at not more than 600° C. Before the second chemical vapor deposition process is carried out, any interconnection has not yet been formed. Namely, an aluminum interconnection, which is thermally unstable, has not yet been formed, when the second chemical vapor deposition process is carried out. The upper limit of the substrate temperature of the second chemical vapor deposition process is increased up to 600° C. The increase in the substrate temperature of the second chemical vapor deposition process causes a further increase in the film density of the tungsten layer deposited by the second chemical vapor deposition process. The further increase in the film density of the tungsten layer emphasizes the effect of suppressing formation of the crystal defects along the center line of the tungsten layer in the hole, whereby the effect of suppressing formation of the seam along the tungsten layer in the hole is emphasized.

It is also preferable that the inter-layer insulator extends over at least a lower level interconnection, and the hole comprises a through hole which reaches the lower level interconnection. If the lower level interconnection comprises an aluminum interconnection, then it is further preferable that the substrate temperature in the second chemical vapor deposition process is maintained in the range of 475° C. to 495° C. in order to avoid any substantive damage to the aluminum interconnection. The aluminum interconnection is thermally unstable, for which reason if the substrate temperature of the second chemical vapor deposition process is above 495° C., it is possible that the aluminum interconnection receives a substantive damage. Namely, if the substrate temperature of the second chemical vapor deposition process is controlled in the range of 475° C. to 495° C., the tungsten layer with the required high film density is formed without providing any substantive damage to the aluminum interconnection It is also preferable that the growth chamber pressure in the second chemical vapor deposition process is maintained in the range of 100 Torr to 150 Torr. The growth chamber pressure of the novel second chemical vapor deposition process is higher than the conventional vapor deposition process. The increase in the growth chamber pressure of the novel second chemical vapor deposition process increases the film density of the tungsten layer deposited by the novel second chemical vapor deposition process. The increase in the film density of the tungsten layer emphasizes the effect of suppressing formation of the crystal defects along the center line of the tungsten layer in the hole, whereby the effect of suppressing formation of the scam along the tungsten layer in the hole is emphasized.

It is also preferable that a flow rate of $WF_6$ source gas in the second chemical vapor deposition process is maintained in the range of 50 sccm to 100 sccm. The flow rate of the source gas of the novel second chemical vapor deposition process of the present invention is lower than the conventional second chemical vapor deposition process. The reduction in the flow rate of the source gas of the second chemical vapor deposition process results in the reduction in the growth rate of the tungsten layer, whereby the film density of the tungsten layer is increased. If the flow rate of $WF_6$ source gas in the second chemical vapor deposition process is controlled to be not more than 100 sccm, then the growth rate of the tungsten layer is sufficiently low and the film density of the tungsten layer is increased. The increase in the film density of the tungsten layer emphasizes the effect of suppressing formation of the crystal defects along the center line of the tungsten layer in the hole, whereby the effect of suppressing formation of the seam along the tungsten layer in the hole is emphasized. If the growth rate of the tungsten layer is less than 50 sccm, then the growth rate is so slow as the practical condition in view of the productivity. For the above reasons, it is preferable that the flow rate of $WF_6$ source gas in the second chemical vapor deposition process is maintained in the range of 50 sccm to 100 sccm. The flow rate of the source gas of the novel second chemical vapor deposition process of the present invention is lower than the conventional second chemical vapor deposition process. The reduction in the flow rate of the source gas of the second chemical vapor deposition process results in the reduction in the growth rate of the tungsten layer, whereby the film density of the tungsten layer is increased. If the flow rate of $WF_6$ source gas in the second chemical vapor deposition process is controlled to be not more than 100 sccm, then the growth rate of the tungsten layer is sufficiently low and the film density of the tungsten layer is increased. The increase in the film density of the tungsten layer emphasizes the effect of suppressing formation of the crystal defects along the center line of the tungsten layer in the hole, whereby the effect of suppressing formation of the seam along the tungsten layer in the hole is emphasized. If the growth rate of the tungsten layer is less than 50 sccm, then the growth rate is so slow as the practical condition in view of the productivity. For the above reasons, it is preferable that the flow rate of $WF_6$ source gas in the second chemical vapor deposition process is maintained in the range of 50 scam to 100 sccm.

It is also preferable that a growth rate of the second chemical vapor deposition process is maintained at about 2000 angstroms per second.

It is also preferable that the first chemical vapor deposition process is carried out at a substrate temperature which is lower than the second chemical vapor deposition process.

It is also preferable that the micro crystal tungsten thin film has a thickness of about 500 angstroms.

It is also preferable that the chemical mechanical polishing process is carried out by use of a polishing agent added with an oxidizing agent since the film density of the tungsten layer is sufficiently high for suppressing the formation of the crystal defects along the center line of the tungsten film in the hole. Tungsten is oxidized by an oxidizing agent of hydrogen peroxide included in a polishing agent so that the oxidized part of the tungsten layer is then shaved by polishing particles. Hydrogen peroxide as the oxidizing agent is in contact with only a top surface of the tungsten layer. However, the suppression to the formation of the crystal defects along the center line of the tungsten layer in the hole prevents hydrogen peroxide as the oxidizing agent from entering into the tungsten layer in the hole, whereby oxidation of the tungsten layer appears but only on the top surface of the tungsten layer. Namely, no oxidation is caused in the tungsten layer in the hole. As a result, the oxidized tungsten on the top surface of the tungsten layer is removed by the chemical mechanical polishing process, whereby the tungsten layer only over the top surface of the insulation layer is removed, whilst the tungsten layer in the hole is not removed. As a result, no seam is formed along the center line of the tungsten layer in the hole. No foreign matters nor extraneous materials enter into the tungsten plug in the hole. No different film is formed over the tungsten plug in the hole, whereby there are raised no problem with contact failure nor problem that a moisture adhered in an inside face of the seam is rapidly evaporated to cause an expansion of the film or peeling the film.

It is also preferable that the barrier layer comprises one of a TiN layer, a TiW layer and a Ti/TiN layer. The barrier layer improves the adhesiveness between the insulation layer or the inter-layer insulator and the tungsten film.

PREFERRED EMBODIMENT

A first embodiment according to the present invention will be described in detail with reference to the drawings. FIGS. 2A through 2F are fragmentary cross sectional elevation views illustrative of semiconductor devices with tungsten plugs in the through holes formed in the inter-layer insulators in sequential steps involved in a novel method of forming the semiconductor device in a first embodiment in accordance with the present invention.

Figure 2A:
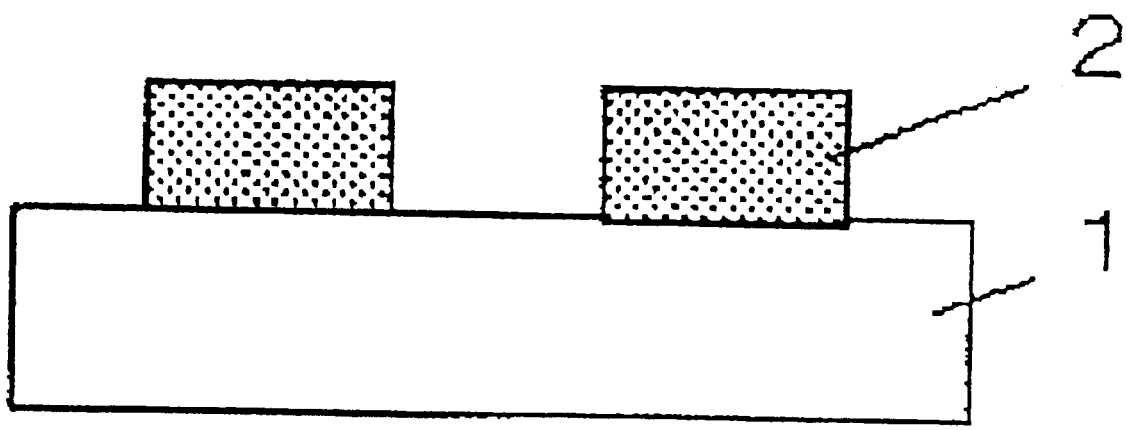
FIGS. 2A through 2F are fragmentary cross sectional elevation views illustrative of semiconductor devices with tungsten plugs in the through holes formed in the inter-layer insulators in sequential steps involved in a novel method of forming the semiconductor device in a first embodiment in accordance with the present invention

With reference to FIG. 2A, a base oxide layer 1 is formed on a surface of a semiconductor substrate which is not illustrated, wherein one or more semiconductor devices are formed on the surface of the semiconductor substrate. A first aluminum interconnection layer is formed on a top surface of the base oxide layer 1. The first aluminum interconnection layer is patterned by a photo-lithography process and a subsequent dry etching process to form plural first level interconnections 2 on the top surface of the base oxide layer 1.

Figure 2B:
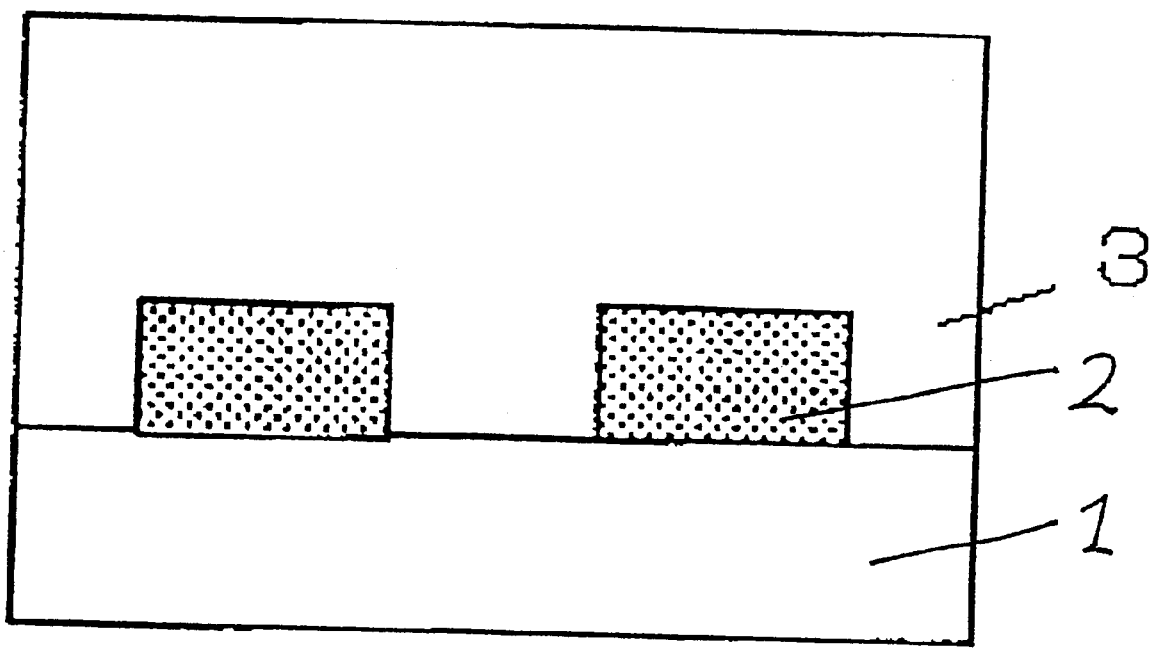

With reference to FIG. 2B, a first inter-layer insulator 3 having a thickness of 1 micrometer is entirely deposited over the first level interconnections 2 and the base oxide layer 1 so that the first level interconnections 2 are completely buried in the first inter-layer insulator 3. A top surface of the first inter-layer insulator 3 is planarized by a first chemical mechanical polishing process to form a planarized of surface of the first inter-layer insulator 3. The first chemical mechanical polishing process is carried out by use of a silica-based polishing agent which is alkaline or neutral. The conditions of the first chemical mechanical polishing process are as follows. A rotation speed of a surface plate is 280 rpm. A carrier rotation number is 17.5 rpm. A load is 6 psi. A wafer load is 5.9 psi. A slurry flow rate is 100 cc/min. A pH value is in the range of 6–13.

Figure 2C:
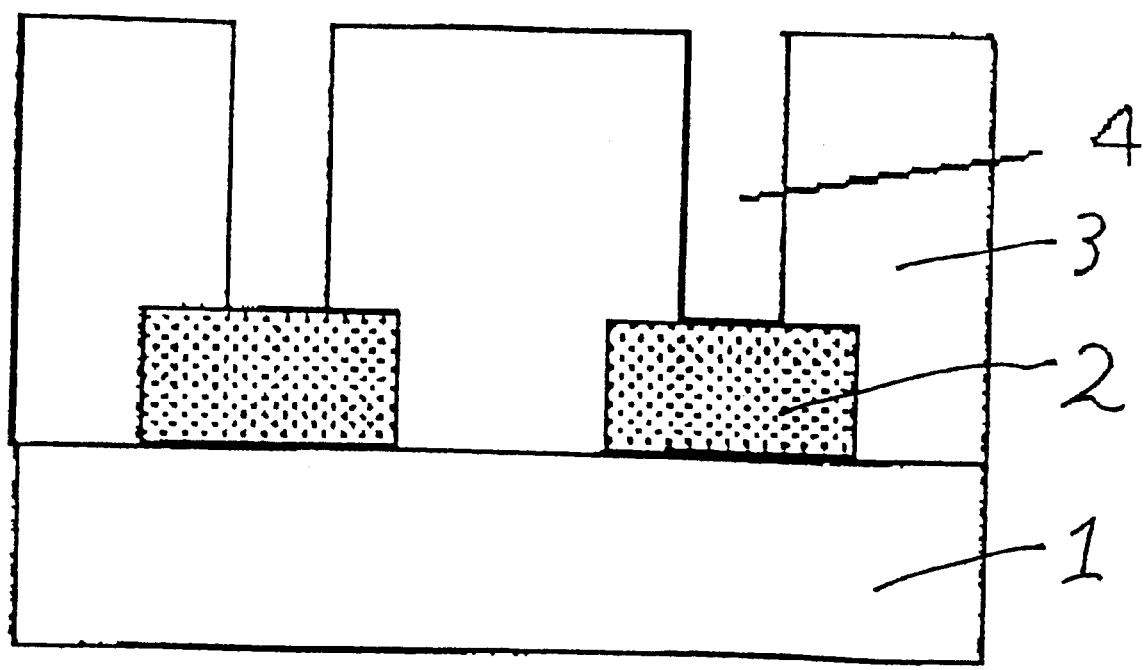

With reference to FIG. 2C, through holes 4 are formed in a the first inter-layer insulator 3 by a photo-lithography process using a KrF beam and a subsequent dry etching process so that the through holes 4 reach top surfaces of the first level interconnections 2, whereby parts of the first level interconnections 2 are shown through the through holes 4. Each of the through holes 4 has a diameter of 0.3 micrometers, a depth of 0.5 micrometers.

Figure 2D:
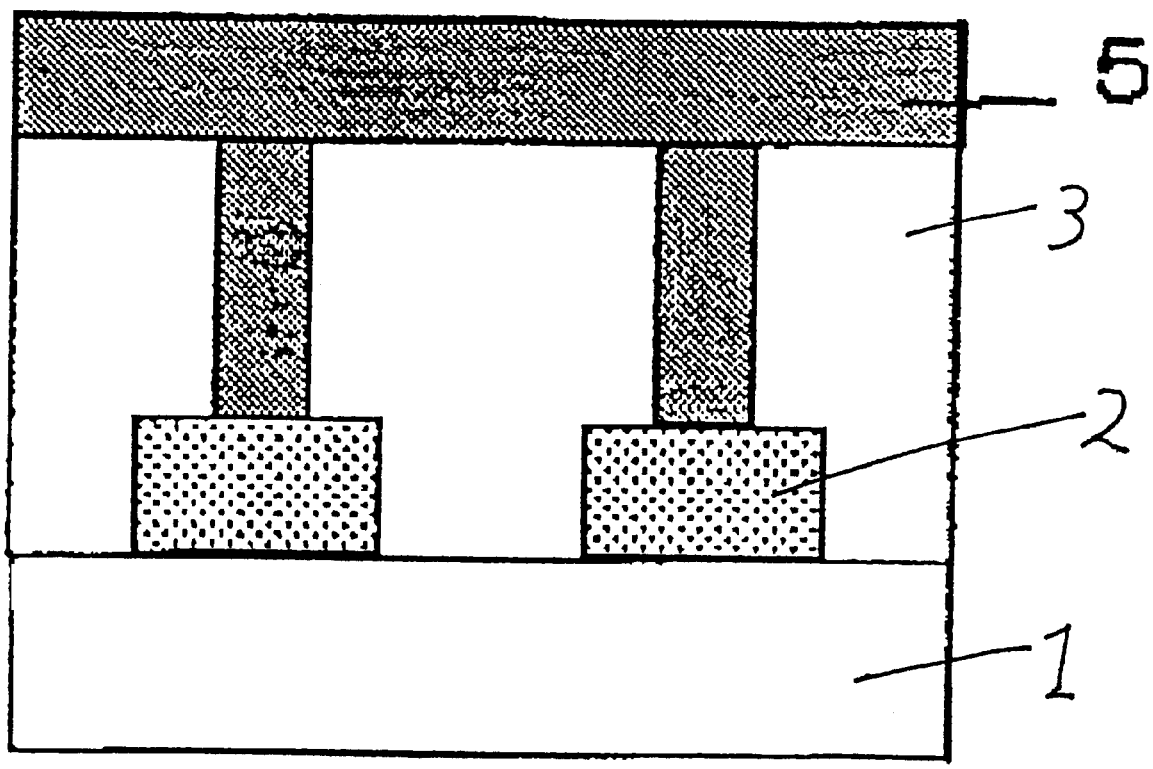

With reference to FIG. 2D, a thin titanium nitride film as a barrier layer not illustrated is entirely deposited by a reactive sputtering method, so that the thin titanium nitride film extends on the top surface of the first inter-layer insulator 3, side walls of the through holes 4 and bottoms of the through holes 4. This thin titanium nitride film serves as a barrier layer which improves an adhesiveness between silicon oxide and tungsten. The thin titanium nitride film as a barrier layer has a thickness of 200 angstroms. The above reactive sputtering process is carried out under the following conditions. A ratio in flow rate of N2 gas to Ar gas is 1:1. A pressure of the growth chamber is 2.5 mTorr. An applied radio frequency power is 4.5 kW. A distance between a target and a sample is 50 mm. A substrate temperature is 200° C.

Subsequently, a thin tungsten core film is grown from micro crystals of tungsten by a first chemical vapor deposition method on the thin titanium nitride film as a barrier layer, so that the thin tungsten core film is formed from the micro crystals of tungsten and the thin tungsten core film extends entirely on the thin titanium nitride film as a barrier layer. The micro crystals of tungsten serve as seeds or cores to be grown up and become the thin tungsten core film. In the process of forming the micro crystals of tungsten, the first chemical vapor deposition process is carried out by utilizing a reduction reaction of $WF_6$ with $SiH_4$, wherein a reaction rate is low. The first chemical vapor deposition process is carried out under the following conditions. A flow rate of $WF_6$ source gas is 300 sccm. A flow rate of $SiH_4$ source gas is 100 sccm. A flow rate of Ar gas is 1000 sccm. A substrate temperature is 400° C. A pressure of the growth chamber is 300 mTorr. When the thin tungsten core film is grown to have a thickness of about 500 angstroms, then the current growth is discontinued. This thin tungsten core film serves as a core for a further growth to a bulk tungsten layer. After the thin tungsten core film has been grown, then the used source gases of the chemical vapor deposition is changed to $WF_6$ and $H_2$, so that a second chemical vapor deposition is carried out by utilizing another reduction reaction of $WF_6$ with $H_2$, wherein the reaction rate is high so that a tungsten layer 5 is grown from the thin tungsten core film, whereby the tungsten layer 5 extends within the through holes 4 and on the top surface of the first inter-layer insulator 3. The second chemical vapor deposition process is carried out under the following conditions. A flow rate of $WF_6$ source gas is 100 sccm. A flow rate of $H_2$ source gas is 600 sccm. A flow rate of Ar gas is 1000 sccm. A substrate temperature 475° C. A pressure of the growth chamber is 90 mTorr. A growth rate of the tungsten film is 2000 angstroms per one minute, which is lower than the growth rate of about 4000 angstroms per one minute of the conventional second chemical vapor deposition process. The tungsten layer 5 deposited by the novel second chemical vapor deposition process has a higher film density than the conventional second chemical vapor deposition process. When the through holes 4 are completely filled with the tungsten layer 5 and the tungsten layer 5 has a thickness of 0.3 micrometers, then the second chemical vapor deposition process is discontinued.

Figure 2E:
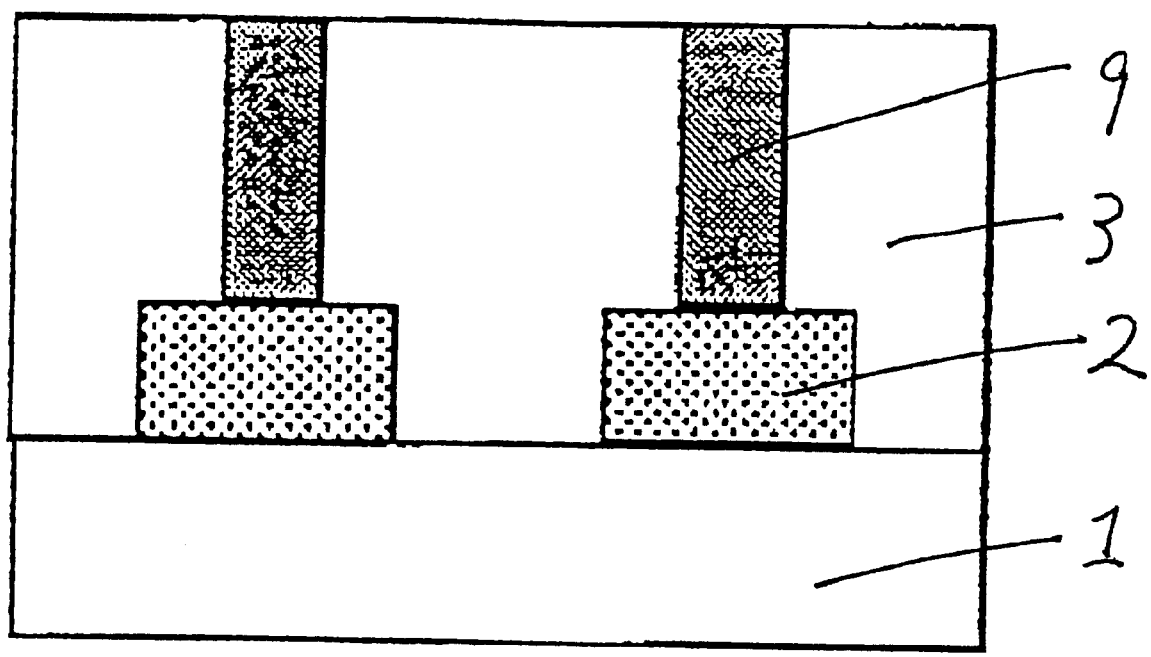

With reference to FIG. 2E, the tungsten layer 5 and the barrier layer, which extend over the top surface of the first inter-layer insulator 3 are removed by a second chemical mechanical polishing process, so that the tungsten layer 5 and the barrier layer remain only within the through holes 4, whereby tungsten plugs 9 having a high film density are formed within the through holes 4. Tops of the tungsten plugs 9 within the through holes 4 are leveled to the top surface of the first inter-layer insulator 3. The second chemical mechanical polishing process is carried out by use of a silica-based polishing agent and hydrogen peroxide as an oxidizing agent. The conditions of the second chemical mechanical polishing process are as follows. A rotation speed of a surface plate is 280 rpm. A carrier rotation number is 17.5 rpm. A load is 6 psi. A wafer load is 5.9 psi. A slurry flow rate is 100 cc/min. A pH value is in the range of 3–5. A concentration of $H_2O_2$ is 10% by weight. After the second chemical mechanical polishing process has been carried out, a surface of the tungsten plug 9 is observed by a scanning electron microscope, whilst a section of the tungsten plug 9 is observed by a transmission electron microscope. No seam exists in the tungsten plug 9.

Figure 2F:
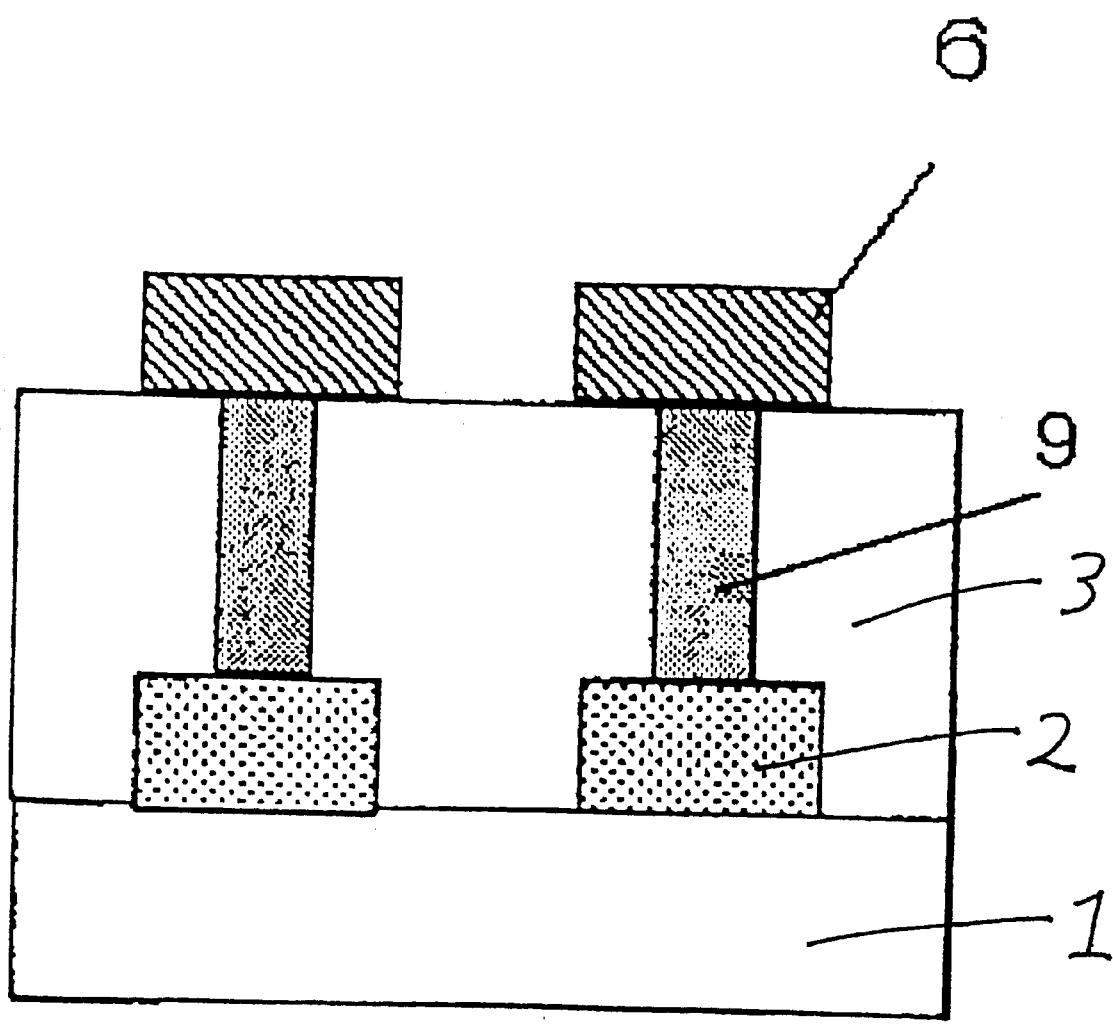

With reference to FIG. 2F, a second aluminum interconnection layer is formed on the top surface of the first inter-layer insulator 3 and on the tops of the tungsten plugs 9 within the through holes 4. The second aluminum interconnection layer is patterned by a photo-lithography process and a subsequent dry etching process to form plural second level interconnections 6 on the tops of the tungsten plugs 9 within the through holes 4, so that the second level interconnections 6 are electrically connected to the first level interconnections 2 through the tungsten plugs 9 within the through holes 4.

As described above, the film density of the tungsten layer 5 is sufficiently high for to suppressing formation of crystal defects or crystal failures along a center line of each of the tungsten layers 5 in the through holes 4. No crystal defect formation along the center line of each of the tungsten layers 5 prevents formation of seam along the center line of each of the tungsten layers 5 in the through holes 4 or the tungsten plugs 9 in the through holes 4 during the above second chemical mechanical polishing process.

In order to obtain the tungsten layer 5 in each of the through hole 4, which has sufficiently high film density for suppressing formation of seam along a center line of the tungsten layer 5 in each of the through holes 4 during a subsequent chemical mechanical polishing process, the second chemical vapor deposition process is carried out at a minimum substrate temperature 475° C. and at a minimum growth chamber pressure of 90 Torr. Therefore, a growth rate of the tungsten layer 5 from the micro crystal tungsten thin film is 2000 angstroms per one minute which is slower than about 4000 angstroms per one minute of the conventional second chemical vapor deposition process. The substrate temperature and the growth chamber pressure of the second chemical vapor deposition process in accordance with the present invention are higher than the conventional conditions of the substrate temperature and the growth chamber pressure of the second chemical vapor deposition process. The above novel conditions for the high substrate temperature and the high growth chamber pressure of the second chemical vapor deposition process cause that the tungsten crystal density of the tungsten layer 5 formed by the chemical vapor deposition is so high as suppressing the formation of crystal defects along the center line of the tungsten layer 5 in each of the through holes 4, and also cause that even when the tungsten layer 5 in each of the through holes 4 is grown to narrow an inner space of each of the through holes 4, sufficient amounts of the source gases are supplied to a growing surface of the tungsten layer 5. A sufficient suppression to formation of the crystal defects along the center line of the tungsten layer 5 in each of the through holes 4 causes that no seam is formed along the center line of the tungsten layer 5 in each of the through holes 4 during the second chemical mechanical polishing process to be carried out after the second chemical vapor deposition process has been carried out. The mechanism of the second chemical mechanical polishing to the tungsten layer 5 is that tungsten is oxidized by an oxidizing agent of hydrogen peroxide included in the polishing agent so that the oxidized part of the tungsten layer 5 is then shaved by polishing particles. Hydrogen peroxide as the oxidizing agent is in contact with only a top surface of the tungsten layer 5. However, the suppression to the formation of the crystal defects along the center line of the tungsten layer 5 in each of the through holes 4 prevents hydrogen peroxide as the oxidizing agent from entering into the tungsten layer 5 in each of the through holes 4, whereby oxidation of the tungsten layer appears but only on the top surface of the tungsten layer 5. Namely, no oxidation is caused in the tungsten layer 5 in each of the through holes 4. As a result, the oxidized tungsten on the top surface of the tungsten layer 5 is removed by the second chemical mechanical polishing process, whereby the tungsten layer 5 only over the top surface of the insulation layer 3 is removed, whilst the tungsten layer S in each of the through holes 4 is not removed. As a result, no seam is formed along the center line of the tungsten layer in the hole. No foreign matters nor extraneous materials enter into the tungsten plug in the hole. No different film is formed over the tungsten plug 9 in each of the through holes 4, whereby there are raised no problem with contact failure nor problem that a moisture adhered in an inside face of the seam is rapidly evaporated to cause an expansion of the film or peeling the film. deposition process is maintained at about 2000 angstroms per minute.

Also, in order to obtain the tungsten layer 5 in each of the through holes 4, which has a reduced film stress, the second chemical vapor deposition process is carried out at a growth chamber pressure of 90 Torr. If the growth chamber pressure of the second chemical vapor deposition process exceeds 150 Torr, then a large stress is applied to the tungsten layer 5 deposited by the second chemical vapor deposition process. In order to reduce the stress of the tungsten layer 5, the growth chamber pressure of the second chemical vapor deposition process is controlled to be 90 Torr.

As a first comparative example, the tungsten plug is formed under the same processes and the same conditions as the above first embodiment, except that the substrate temperature of the second chemical vapor deposition process is 450° C. which is lower than the lower limit of the acceptable range of the substrate temperature. After the second chemical mechanical polishing process has been carried out, a surface of the tungsten plug 9 is observed by a scanning electron microscope, whilst a section of the tungsten plug 9 is observed by a transmission electron microscope. A seam exists along the center line of the tungsten plug 9 in each of the through holes 4.

As a second comparative example, the tungsten plug is formed under the same processes and the same conditions as the above first embodiment, except that the growth chamber pressure of the second chemical vapor deposition process is 80 Torr which is lower than the lower limit of the acceptable range of the growth chamber pressure. After the second chemical mechanical polishing process has been carried out, a surface of the tungsten plug 9 is observed by a scanning electron microscope, whilst a section of the tungsten plug 9 is observed by a transmission electron microscope. A seam exists along the center line of the tungsten plug 9 in each of the through holes 4.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of forming a tungsten layer having a high film density, which at least fills a hole of an insulation layer, said method comprising the steps of:

carrying out a first chemical vapor deposition process for growing a micro crystal tungsten thin film on at least an inside face of the hole; and carrying out a second chemical vapor deposition process for growing a tungsten layer from said micro crystal tungsten thin film so that said tungsten layer at least fills said hole, wherein said second chemical vapor deposition process is carried out at a substrate temperature of not less than 475° C. and at a growth chamber pressure in the range of 90 Torr to 150 Torr, so that said tungsten layer has a high film density;

wherein said first chemical vapor deposition process is carried out at a substrate temperature which is lower than said second chemical vapor deposition process.

2. The method as claimed in claim 1, wherein said insulation layer comprises an inter-layer insulator extending over a top surface of a semiconductor substrate, and said top surface of a semiconductor substrate has at least a semiconductor device, and said hole comprises a contact hole which reaches said semiconductor device.

3. The method as claimed in claim 2, wherein said substrate temperature in said second chemical vapor deposition process is maintained at not more than 600° C.

4. The method as claimed in claim 1, wherein said insulation layer comprises an inter-layer insulator extending over at least a lower level interconnection, and said hole comprises a through hole which reaches said lower level interconnection.

5. The method as claimed in claim 4, wherein said lower level interconnection comprises an aluminum interconnection and said substrate temperature in said second chemical vapor deposition process is maintained in the range of 475° C. to 495° C.

6. The method as claimed in claim 1, wherein said growth chamber pressure in said second chemical vapor deposition process is maintained in the range of 100 Torr to 150 Torr.

7. The method as claimed in claim 1, wherein a flow rate of WF6 source gas in said second chemical vapor deposition process is maintained in the range of 50 sccm to 100 sccm.

8. A method of forming a tungsten layer having a high film density, which at least fills a hole of an insulation layer, said method comprising the steps of:

carrying out a first chemical vapor deposition process for growing a micro crystal tungsten thin film on at least an inside face of the hole; and carrying our a second chemical vapor deposition process for growing a tungsten layer from said micro crystal tungsten thin film so that said tungsten layer at least fills said hole, wherein said second chemical vapor deposition process is carried out at a substrate temperature of not less than 475° C. and at a growth chamber pressure in the range of 90 Torr to 150 Torr, so that said tungsten layer has a high film density; and wherein a growth rate of said second chemical vapor deposition process is maintained at about 2000 angstroms per minute.

9. The method as claimed in claim 1, wherein said micro crystal tungsten thin film has a thickness of about 500 angstroms.

10. A method of forming a tungsten layer having a high film density, which at least fills a hole of an insulation layer, said method comprising the steps of:

carrying out a first chemical vapor deposition process for growing a micro crystal tungsten thin film on at least an inside face of the hole, wherein said tungsten layer extends not only in said hole but also over a top surface of said insulation layer;

carrying out a second chemical vapor deposition process for growing a tungsten layer from said micro crystal tungsten thin film so that said tungsten layer at least fills said hole, said second chemical vapor deposition process being carried out at a substrate temperature of not less than 475° C. and at a growth chamber pressure in the range of 90 Torr to 150 Torr, so that said tungsten layer has a high film density; and carrying out a chemical mechanical polishing process, after said second chemical vapor deposition process, for selectively removing said tungsten layer over said top surface of said insulation layer and leaving said tungsten layer in said hole, thereby to form a tungsten plug in said hole.

11. The method as claimed in claim 10, wherein said chemical mechanical polishing process is carried out by use of a polishing agent added with an oxidizing agent.

12. The method as claimed in claim 1, further comprising a step of forming a thin barrier layer on at least said inside face of said hole before said first chemical vapor deposition process is then carried out to form said micro crystal tungsten thin film on said thin barrier layer.

13. The method as claimed in claim 12, wherein said barrier layer comprises one of a TiN layer, a TiW layer and a Ti/TiN layer.

14. A method of forming a tungsten plug in a hole of an insulation layer, said method comprising the steps of:

carrying out a first chemical vapor deposition process for growing a micro crystal tungsten thin film on at least an inside face of the hole;

carrying our a second chemical vapor deposition process for growing a tungsten layer from said micro crystal tungsten thin film so that said tungsten layer fills said hole and also extends over a top surface of said insulation layer; and carrying out a chemical mechanical polishing process for selectively removing said tungsten layer over said top surface of said insulation layer and leaving said tungsten layer in said hole, thereby to form a tungsten plug in said hole, wherein said second chemical vapor deposition process is carried out at a substrate temperature of not less than 475° C. and at a growth chamber pressure in the range of 90 Torr to 150 Torr, so that said tungsten layer has a high film density.

15. The method as claimed in claim 14, wherein said insulation layer comprises an inter-layer insulator extending over a top surface of a semiconductor substrate, and said top surface of a semiconductor substrate has at least a semiconductor device, and said hole comprises a contact hole which reaches said semiconductor device.

16. The method as claimed in claim 15, wherein said substrate temperature in said second chemical vapor deposition process is maintained at not more than 600° C.

17. The method as claimed in claim 14, wherein said insulation layer comprises an inter-layer insulator extending over at least a lower level interconnection, and said hole comprises a through hole which reaches said lower level interconnection.

18. The method as claimed in claim 17, wherein said lower level interconnection comprises an aluminum interconnection and said substrate temperature in said second chemical vapor deposition process is maintained in the range of 475° C. to 495° C.

19. The method as claimed in claim 14, wherein said growth chamber pressure in said second chemical vapor deposition process is maintained in the range of 100 Torr to 150 Torr.

20. The method as claimed in claim 14, wherein a flow rate of WF6 source gas in said second chemical vapor deposition process is maintained in the range of 50 sccm to 100 sccm.

21. The method as claimed in claim 14, wherein a growth rate of said second chemical vapor deposition process is maintained at about 2000 angstroms per minute.

22. The method as claimed in claim 14, wherein said first chemical vapor deposition process is carried out at a substrate temperature which is lower than said second chemical vapor deposition process.

23. The method as claimed in claim 14, wherein said micro crystal tungsten thin film has a thickness of about 500 angstroms.

24. The method as claimed in claim 14, wherein said chemical mechanical polishing process is carried out by use of a polishing agent added with an oxidizing agent.

25. The method as claimed in claim 14, further comprising a step of forming a thin barrier layer on at least said inside face of said hole before said first chemical vapor deposition process is then carried out to form said micro crystal tungsten thin film on said thin barrier layer.

26. The method as claimed in claim 25, wherein said barrier layer comprises one of a TiN layer, a TiW layer and a Ti/TiN layer.

27. A method of forming a tungsten plug in a hole of an inter-layer insulator, said method comprising the steps of:

forming at least a hole in an inter-layer insulator;

forming a thin barrier layer on at least an inside face of a hole;

carrying out a first chemical vapor deposition process for growing a micro crystal tungsten thin film on said thin barrier layer;

carrying our a second chemical vapor deposition process for growing a tungsten layer from said micro crystal tungsten thin film so that said tungsten layer fills said hole and also extends over a top surface of said inter-layer insulator; and carrying out a chemical mechanical polishing process for selectively removing said tungsten layer over said top surface of said inter-layer insulator and leaving said tungsten layer in said hole, thereby to form a tungsten plug in said hole, wherein said second chemical vapor deposition process is carried out at a substrate temperature of not less than 475° C. and at a growth chamber pressure in the range of 90 Torr to 150 Torr, so that said tungsten layer has a high film density.

28. The method as claimed in claim 27, wherein said inter-layer insulator extends over a top surface of a semiconductor substrate, and said top surface of said semiconductor substrate has at least a semiconductor device, and said hole comprises a contact hole which reaches said semiconductor device.

29. The method as claimed in claim 28, wherein said substrate temperature in said second chemical vapor deposition process is maintained at not more than 600° C.

30. The method as claimed in claim 27, wherein said inter-layer insulator extends over at least a lower level interconnection, and said hole comprises a through hole which reaches said lower level interconnection.

31. The method as claimed in claim 30, wherein said lower level interconnection comprises an aluminum interconnection and said substrate temperature in said second chemical vapor deposition process is maintained in the range of 475° C. to 495° C.

32. The method as claimed in claim 27, wherein said growth chamber pressure in said second chemical vapor deposition process is maintained in the range of 100 Torr to 150 Torr.

33. The method as claimed in claim 27, wherein a flow rate of WF6 source gas in said second chemical vapor deposition process is maintained in the range of 50 sccm to 100 sccm.

34. The method as claimed in claim 27, wherein a growth rate of said second chemical vapor deposition process is maintained at about 2000 angstroms per minute.

35. The method as claimed in claim 27, wherein said first chemical vapor deposition process is carried out at a substrate temperature which is lower than said second chemical vapor deposition process.

36. The method as claimed in claim 27, wherein said micro crystal tungsten thin film has a thickness of about 500 angstroms.

37. The method as claimed in claim 27, wherein said chemical mechanical polishing process is carried out by use of a polishing agent added with an oxidizing agent.

38. The method as claimed in claim 27, wherein said barrier layer comprises one of a TiN layer, a TiW layer and a Ti/TiN layer.

* * * * *